(12) United States Patent
Goodwin-Johansson (10) Patent No.: US 6,396,620 B1
(45) Date of Patent: May 28, 2002

(54) ELECTROSTATICALLY ACTUATED ELECTROMAGNETIC RADIATION SHUTTER

(75) Inventor: Scott H. Goodwin-Johansson, Pittsboro, NC (US)

(73) Assignee: MCNC, Research Triangle Park, NC (US)

(*) Notice: Subject to any disclaimer, the term of this patent is extended or adjusted under 35 U.S.C. 154(b) by 29 days.

(21) Appl. No.: 09/702,082

(22) Filed: Oct. 30, 2000

(51) Int. Cl.[7] ................................................ G02B 26/00
(52) U.S. Cl. ...................... 359/292; 359/291; 359/230; 359/227
(58) Field of Search ................................. 359/278, 292, 359/291, 871, 231, 230, 245, 249, 279, 227; 438/14, 667, 626

(56) References Cited

U.S. PATENT DOCUMENTS

| | | | |
|---|---|---|---|
| 3,471,641 | A | 10/1969 | Baker et al. |
| 3,917,196 | A | 11/1975 | Pond et al. |
| 4,025,193 | A | 5/1977 | Pond et al. |
| 4,073,567 | A | 2/1978 | Lakerveld et al. |
| 4,143,946 | A | 3/1979 | Leo et al. |
| 4,230,393 | A | 10/1980 | Burke, Jr. |
| 4,317,611 | A | 3/1982 | Petersen |
| 4,361,911 | A | 11/1982 | Buser et al. |
| 4,517,569 | A | 5/1985 | Gerharz |

(List continued on next page.)

FOREIGN PATENT DOCUMENTS

| | | |
|---|---|---|
| DE | 32 30 159 C1 | 4/1983 |
| DE | 42 35 593 A1 | 10/1993 |
| EP | 0 834 759 A2 | 4/1998 |
| WO | WO95/23352 | 8/1995 |

OTHER PUBLICATIONS

Motamedi et al.; Development of Micro–Electro–Mechanical Optical Scanner, Optical Engineering, May 1997, pp.1346–1352, vol. 35, No. 5, Society of Photo–Optical Instrumentation Engineers.

Behin et al. Magetically Actuated Micromirrors for Fiber–Optic Switching, Solid–State Sensor and Actuator Workshop, Hilton Head Island, South Carolina, Jun. 8–11, 1998, pp. 273–276.

(List continued on next page.)

Primary Examiner—Loha Ben
Assistant Examiner—Omar Hindi
(74) Attorney, Agent, or Firm—Alston & Bird LLP (57) ABSTRACT

An electromagnetic radiation shutter device driven by electrostatic forces comprises a stationary membrane capable of allowing electromagnetic radiation transmission therethrough, and a first and second flexible membrane comprising an electrode element and at least one biasing element. The first flexible membrane has a fixed portion attached to the underside of the stationary membrane and a distal portion adjacent to the fixed portion and released from the underside of the stationary membrane. The second flexible membrane has a fixed portion attached to the topside of the stationary membrane and a distal portion adjacent to the fixed portion and released from the topside of the stationary membrane. In operation, a voltage differential is established between the electrode element of the first flexible membrane and the electrode element of the second flexible membrane thereby moving the first and second flexible membranes relative to the stationary membrane. In a closed state (i.e. fully activated), the flexible membranes will be generally parallel to the stationary membrane and will be capable of deflecting electromagnetic radiation. In an open state (i.e. no voltage applied), the flexible membranes will generally be fully curled based on biasing in the flexible membranes induced during fabrication and/or imparted by material characteristics.

34 Claims, 7 Drawing Sheets

U.S. PATENT DOCUMENTS

| | | |
|---|---|---|
| 4,618,223 A | 10/1986 | Fried |
| 4,708,420 A | 11/1987 | Liddiard |
| 4,710,732 A | 12/1987 | Hornbeck |
| 4,732,440 A | 3/1988 | Gadhok |
| 5,061,049 A | 10/1991 | Hornbeck |
| 5,083,857 A | 1/1992 | Hornbeck |
| 5,097,354 A | 3/1992 | Goto |
| 5,172,262 A | 12/1992 | Hornbeck |
| 5,202,785 A | 4/1993 | Nelson |
| 5,212,582 A | 5/1993 | Nelson |
| 5,233,459 A | 8/1993 | Bozler et al. |
| 5,258,591 A | 11/1993 | Buck |
| 5,260,596 A | 11/1993 | Dunn et al. |
| 5,268,696 A | 12/1993 | Buck et al. |
| 5,278,368 A | 1/1994 | Kasano et al. |
| 5,311,360 A | 5/1994 | Bloom et al. |
| 5,349,855 A | 9/1994 | Bernstein et al. |
| 5,353,656 A | 10/1994 | Hawkey et al. |
| 5,367,136 A | 11/1994 | Buck |
| 5,367,584 A | 11/1994 | Ghezzo et al. |
| 5,392,650 A | 2/1995 | O'Brien et al. |
| 5,408,355 A | 4/1995 | Rauch et al. |
| 5,408,877 A | 4/1995 | Greiff et al. |
| 5,479,042 A | 12/1995 | James et al. |
| 5,488,863 A | 2/1996 | Mochida et al. |
| 5,492,596 A | 2/1996 | Cho |
| 5,496,436 A | 3/1996 | Bernstein et al. |
| 5,507,911 A | 4/1996 | Greiff |
| 5,515,724 A | 5/1996 | Greiff et al. |
| 5,530,342 A | 6/1996 | Murphy |
| 5,535,902 A | 7/1996 | Greiff |
| 5,536,988 A | 7/1996 | Zhang et al. |
| 5,543,765 A | 8/1996 | Cachier |
| 5,544,001 A | 8/1996 | Ichiya et al. |
| 5,552,925 A | 9/1996 | Worley |
| 5,568,307 A | 10/1996 | Williams |
| 5,578,976 A | 11/1996 | Yao |
| 5,606,447 A | 2/1997 | Asada et al. |
| 5,616,864 A | 4/1997 | Johnson et al. |
| 5,619,061 A | 4/1997 | Goldsmith et al. |
| 5,620,933 A | 4/1997 | James et al. |
| 5,627,396 A | 5/1997 | James et al. |
| 5,629,565 A | 5/1997 | Schlaak et al. |
| 5,629,790 A | 5/1997 | Neukermans et al. |
| 5,635,638 A | 6/1997 | Geen |
| 5,635,639 A | 6/1997 | Greiff et al. |
| 5,635,640 A | 6/1997 | Geen |
| 5,635,739 A | 6/1997 | Grieff et al. |
| 5,638,946 A | 6/1997 | Zavracky |
| 5,640,133 A | 6/1997 | MacDonald et al. |
| 5,650,568 A | 7/1997 | Greiff et al. |
| 5,652,374 A | 7/1997 | Chia et al. |
| 5,656,778 A | 8/1997 | Roszhart |
| 5,661,592 A | 8/1997 | Bornstein et al. |
| 5,666,258 A | 9/1997 | Gevatter et al. |
| 5,673,139 A | 9/1997 | Johnson |
| 5,673,785 A | 10/1997 | Schlaak et al. |
| 5,677,823 A | 10/1997 | Smith |
| 5,696,662 A | 12/1997 | Bauhahn |
| 5,723,894 A | 3/1998 | Ueno et al. |
| 5,757,562 A | 5/1998 | Appollonov et al. |
| 5,818,683 A | 10/1998 | Fujii |
| 5,862,003 A | 1/1999 | Saif et al. |
| 5,867,302 A | 2/1999 | Fleming |
| 5,914,553 A | 6/1999 | Adams et al. |
| 6,067,183 A | 5/2000 | Furlani et al. |
| 6,127,908 A | 10/2000 | Bozler et al. |
| 6,175,443 B1 | 1/2001 | Aksyuk et al. |
| 6,223,088 B1 | 4/2001 | Scharnberg et al. |
| 6,229,683 B1 | 5/2001 | Goodwin-Johansson |
| 6,229,684 B1 | 5/2001 | Cowen et al. |
| 6,236,491 B1 | 5/2001 | Goodwin-Johansson |
| 2001/0053016 A1 * | 12/2001 | Nelson ..................... 359/292 |
| 2002/0001122 A1 * | 1/2002 | Ko et al. ................... 359/292 |

OTHER PUBLICATIONS

Jaecklin et al., Mechanical and Optical Properties of Surface Micromachined Torsional Mirrors in Silicon, Polysilicon and Aluminum, The 7th International Conference on Solid–State Sensors and Actuators, pp. 958–961.

Gunawan et al., Micromachined Corner Cube Reflectors as a Communication Link, Sensors and Actuators A, Mar./Apr. 1995, pp. 580–583, A47 Nos. 1/3, Elsevier Science S.A., Lausanne, CH.

Jaecklin et al., Optical Microshutters and Torsional Micromirrors for Light Modulator Arrays, Paper, 4 pages.

Goto et al., Scanning Optical Sensor for Micro Robot, Paper, 6 pages.

Petersen et al., Silicon Torsional Scanning Mirror, IBM Journal Res. Develop., Sep. 1980, vol. 24, No. 5, pp. 631–637, San Jose, California.

Walker et al., A Silicon Optical Modulator with 5 MHz Operation for Fiber–In–The–Loop Applications, The 8th International Conference on Solid–State Sensors and Actuators and Eurosensors IX, Stockholm, Sweden, Jun. 25–29, 1995, Digest of Technical Papers, vol. 1, Sessions A1–PD6, Papers No. 1–231, pp. 285–288.

Haji–Babaer et al., Integrable Active Microvalve with Surface Micromachined Curled–Up Actuator, Transducers '97, 1997 International Conference on Solid–State Sensors and Actuators, Chicago, Illinois, Jun. 16–19, 1997, pp. 833–836.

Klaassen et al., Silicon Fusion Bonding and Deep Reactive Ion Etching; A New Technology for Microstructures, Sensors and Actuators A–52 (1996), pp. 132–139.

Elwenspoek et al., Static and Dynamic Properties of Active Joints, The 8th International Conference on Solid–State Sensors and Actuators and Eurosensors IX, Stockholm, Sweden, Jun. 25–29, 1995, pp. 412–415.

Schiele et al., Surface–Micromachined Electrostatic Microrelay, Sensors and Actuators A 66 (1998), pp. 345–354.

* cited by examiner

ELECTROSTATICALLY ACTUATED ELECTROMAGNETIC RADIATION SHUTTER

FIELD OF THE INVENTION

The present invention relates to an electromagnetic radiation shutter, and more particularly to a microelectromechanical system (MEMS) dual electrostatic flexible membrane shutter capable of deflecting electromagnetic radiation.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully used to controllably move micromachined structures. Controlled thermal expansion of actuators or other MEMS components has been used to create forces for driving microdevices. One such device is found in U.S. Pat. No. 5,475,318 entitled "Microprobe" issued Dec. 12, 1995 in the name of inventors Marcus et al., which leverages thermal expansion to move a microdevice. A micro cantilever is constructed from materials having different thermal coefficients of expansion. When heated, the bimorph layers arch differently, causing the micro cantilever to move accordingly. A similar mechanism is used to activate a micromachined thermal switch as described in U.S. Pat. No. 5,463,233 entitled "Micromachined Thermal Switch" issued Oct. 31, 1995 in the name of inventor Norling.

Electrostatic forces have also been used to move structures. Traditional electrostatic devices were constructed from laminated films cut from plastic or Mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,339 entitled "Method for Making Rolling Electrode for Electrostatic Device" issued May 12, 1981 in the name of inventor Kalt. These devices work well for typical motive applications, but these devices cannot be constructed in dimensions suitable for miniaturized integrated circuits, biomedical applications, or MEMS structures.

Figure 1:
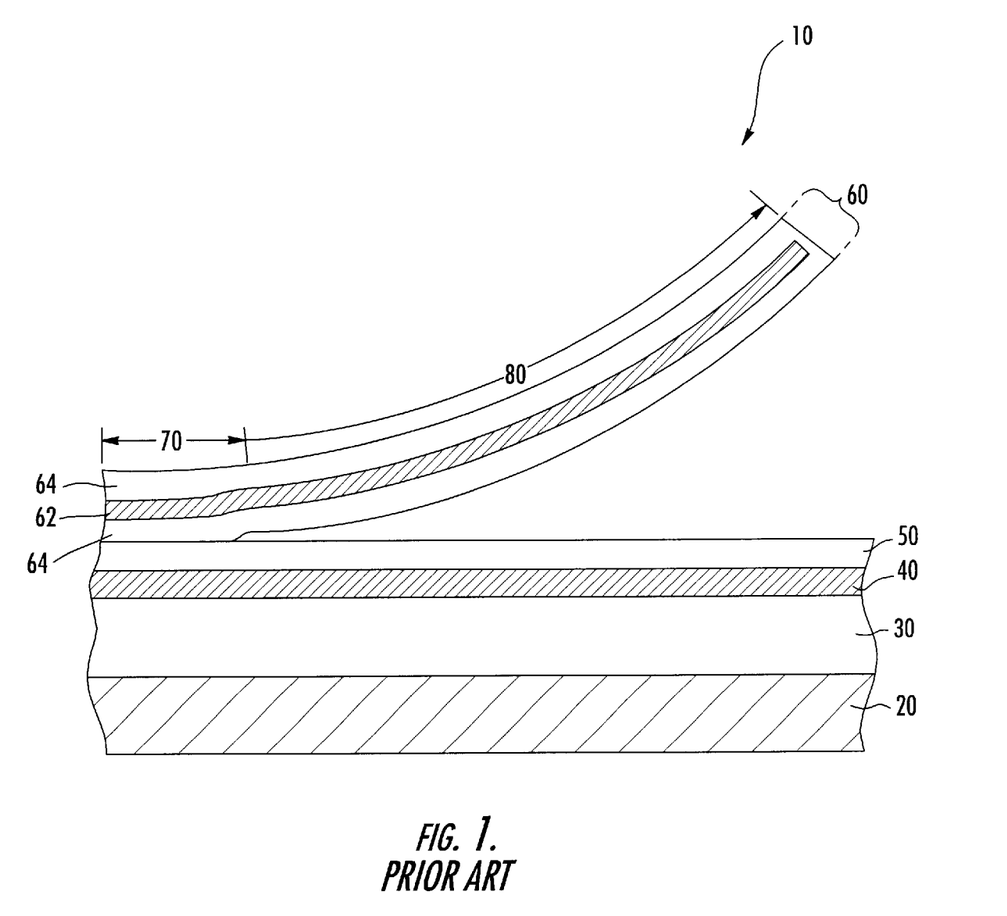
FIG. 1 is a cross-sectional view of a MEMS flexible membrane device, in accordance with the prior art.

MEMS electrostatic devices are used advantageously in various applications because of their extremely small size. Electrostatic forces due to the electric field between electrical charges can generate relatively large forces given the small electrode separations inherent in MEMS devices. Referring to FIG. 1 shown is a MEMS flexible membrane electrostatic device 10 as described in detail in U.S. patent application Ser. No. 09/464,010, entitled "Electrostatically Controlled Variable Capacitor", filed on Dec. 15, 1999, in the name of inventor Goodwin-Johansson and assigned to MCNC, the assignee of the present invention. That application is herein incorporated by reference as if set forth fully herein. The MEMS flexible membrane device comprises in layers a substrate 20, a first insulating layer 30, a substrate electrode 40, a substrate insulator 50 and a flexible membrane 60. The flexible membrane is generally planar and overlies a portion of the substrate and, generally, the entirety of the substrate electrode. The flexible membrane typically comprises multiple layers including at least one electrode layer 62 and at least one biasing/insulating layer 64.

The flexible membrane may be defined as having two portions; referred to as the fixed portion 70, and the distal portion 80. The portions are defined horizontally along the length of the moveable composite. The fixed portion is substantially affixed to the underlying substrate or intermediate layers at the flexible membrane to substrate attachment point. The distal portion is released from the underlying substrate or intermediate layers during fabrication of the MEMS device.

Figure 2:
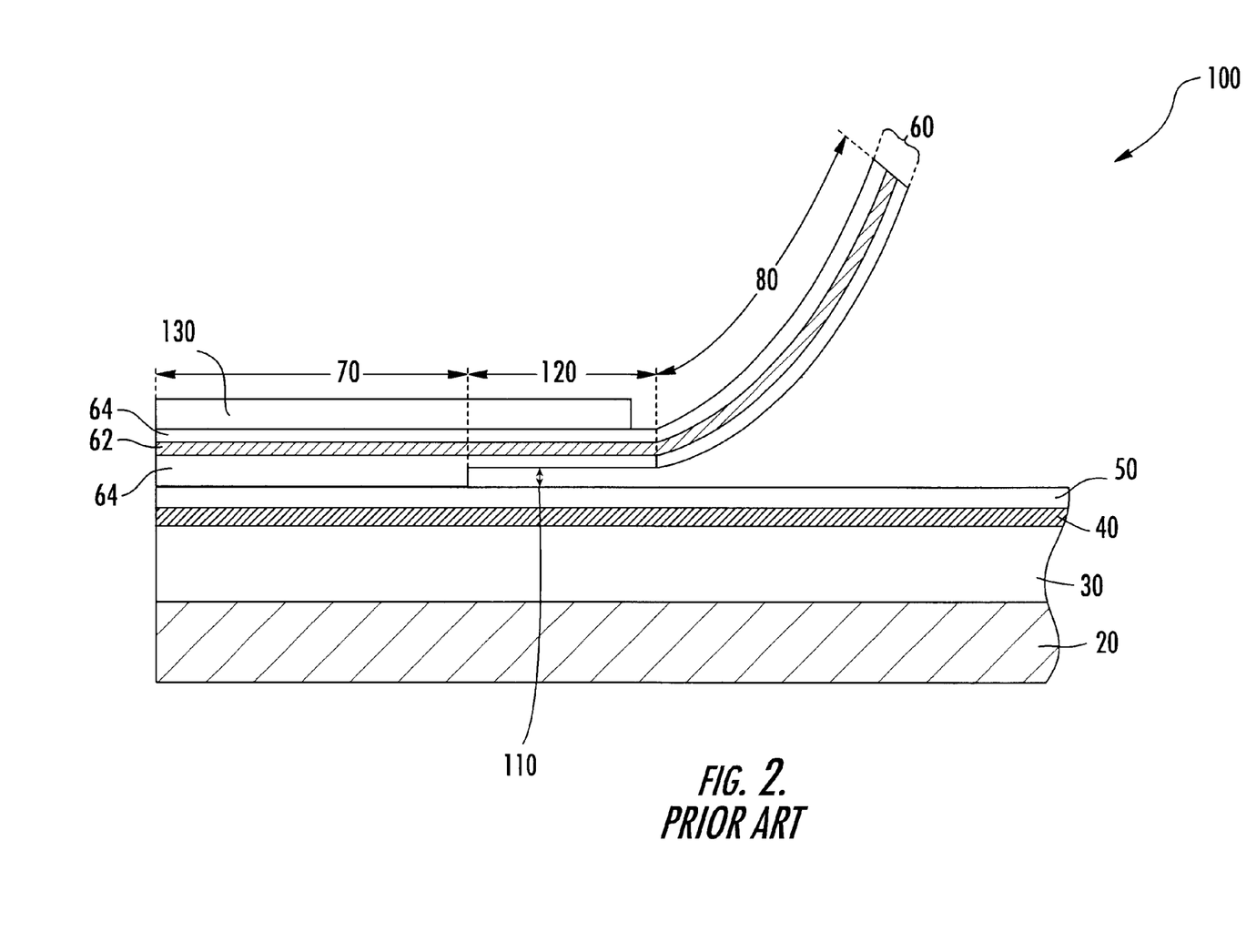
FIG. 2 is a cross-sectional view of a MEMS flexible membrane device having a predefined air gap between the membrane and the substrate, in accordance with the prior art.

Referring to FIG. 2, shown is an alternate embodiment of a MEMS moveable membrane device 100 having a predefined air gap 110 underlying a medial portion 120 of the moveable composite. The medial portion extends from the fixed portion 70 and is held in position or biased without the application of electrostatic force. The air gap results from the release operation employed during fabrication of the MEMS device. During operation the distal portion is free to move, characteristically curling away from the underlying planar surface in the absence of electrostatic forces. The medial portion maintains a non-increasing separation (i.e. the separation is either constant or decreasing) with respect to the underlying planar surface until the flexible membrane begins to bend toward the substrate. As shown an auxiliary biasing layer 130 overlies the electrode layer and structurally constrains the medial portion. By predefining the shape of the air gap, recently developed MEMS electrostatic devices can operate with lower and less erratic operating voltages. For a more comprehensive discussion of MEMS moveable membrane devices having a predetermined air gap see U.S. patent application Ser. No. 09/320,891, entitled "Micromachined Electrostatic Actuator with Air Gap", filed on May 27, 1999, in the name of inventor Goodwin-Johansson and assigned to MCNC the assignee of the present invention. That application is herein incorporated by reference as if set forth fully herein.

Optical displays have been formed that utilize metallized polymer films as one electrode and a second rigid electrode. In application, when voltage is applied between the two electrodes the metallized polymer electrode deflects and is attracted toward the fixed electrode. In particular, the metallized polymer film is typically a rolled up (fully curled) structure prior to application of the voltage as a means of minimizing the overall size of the electrode. Typical prior art optical displays will employ polymer films ranging from 1–4 micrometers in thickness and metal films ranging from 300 to 1000 angstroms in thickness. The display shutters are typically greater than 2 millimeters on a side such that the shutter rolls up to less than 10 percent of the total area. In addition, these shutters have benefited from the use of optically transparent conductive films, such as indium tin oxide (ITO), fabricated on transparent substrates, such as glass, to form an optically transparent fixed electrode.

The present problem is that no film currently exists that is both conductive and completely transparent to a wide frequency range of RF electromagnetic radiation. For any conductive material and frequency of RF electromagnetic radiation, there can be calculated a skin depth of $\delta=\text{sqrt}(2/((\omega\mu\sigma)))$. A layer of conductive material more than a few skin depths in thickness will severely attenuate and reflect incident electromagnetic radiation. The skin depth for a gold film with 40 GHz radiation is 0.37 micrometers. Thus, it is not presently feasible to construct a shutter that has an RF transparent fixed electrode. What is desired is a structure that can serve as a shutter for electromagnetic radiation and, more specifically, a MEMS electromagnetic radiation shutter. A MEMS structure is highly preferred because it offers ease in fabrication, thus minimal cost, and can be operated with relatively low electrostatic power. Such a device would be capable of being implemented in a single MEMS device or in larger macroscopic systems.

SUMMARY OF THE INVENTION

The present invention provides for an electromagnetic radiation shutter driven by electrostatic force that is capable of deflecting electromagnetic radiation while benefiting ease in fabrication, low power consumption and minimal cost per unit. Further, methods for using and making the electromagnetic radiation shutter according to the present invention are provided.

An electromagnetic radiation shutter device driven by electrostatic forces according to the present invention comprises a stationary membrane capable of allowing electromagnetic radiation transmission therethrough, and a first and second flexible membrane comprising an electrode element and at least one biasing element. The first flexible membrane has a fixed portion attached to the underside of the stationary membrane and a distal portion adjacent to the fixed portion and released from the underside of the stationary membrane. The second flexible membrane has a fixed portion attached to the topside of the stationary membrane and a distal portion adjacent to the fixed portion and released from the topside of the stationary membrane.

In operation, a voltage differential is established between the electrode element of the first flexible membrane and the electrode element of the second flexible membrane thereby moving the first and second flexible membranes relative to the stationary membrane. In a closed state (i.e. fully activated), the flexible membranes will be generally parallel to the stationary membrane and will capable of deflecting RF electromagnetic radiation. In an open state (i.e. no voltage applied), the flexible membranes will generally be fully curled based on biasing in the flexible membranes induced during fabrication and/or imparted by material characteristics.

In one embodiment of the electromagnetic radiation shutter it will be supported by a frame structure that serves to support the stationary membrane and allow for the unrestrained movement of the flexible membranes from an open state to a closed state and back to an open state. The frame structure may comprise a substrate or other suitable means of supporting the stationary membrane.

In another embodiment of the invention the first and second flexible membranes will comprise a layered construct of a first biasing/insulation layer, an electrode layer and a second biasing/insulation layer. The biasing/insulation layers are typically chosen from a group of materials that are capable of providing the necessary positional biasing to the membrane and the required electrical insulation to the electrodes. The electrode layer comprises a conductive material, such as gold. In instances where gold is used to form the electrode layers, an adhesion-promoting layer may be used between the gold layer and adjacent layers to insure adequate adhesion. The stationary membrane will typically comprise a non-conductive organic insulator material that is capable of allowing RF transmission.

In another embodiment of the invention the electrode elements of the first and second membranes will have a predetermined plan view shape that minimizes power consumption and adds to shutter efficiency. In one such embodiment the electrode elements will be patterned and disposed having a generally tapered plan view shape, with the widest area nearest the fixed portion of the membrane and the narrowest portion furthest from the fixed portion of the membrane. Such a configuration is intended to allow for the analog control of the closing of the flap where different applied voltages correspond to different amounts of unrolling.

Alternatively, another embodiment of the present invention provides for a method of using the electromagnetic radiation shutter of the present invention. The method comprised providing for an electromagnetic radiation shutter having a stationary membrane capable of allowing electromagnetic radiation transmission therethrough, a first flexible membrane attached to the underside of the stationary membrane and comprising an electrode element and at least one biasing element, and a second flexible membrane attached to the topside of the flexible membrane and comprising an electrode element and at least one biasing element. Electromagnetic radiation is then transmitted through the stationary membrane followed by the application of electrostatic voltage across the electrode elements of the first and second flexible membrane. The application of the electrostatic voltage causes the membranes to move from an open state in which the membranes are generally curled to a closed state in which the membranes are generally parallel with the stationary membrane. Once the membranes are in a closed state, generally parallel with the stationary membrane, the electromagnetic radiation is then properly deflected as the application warrants.

Additionally, the invention is embodied in a method of fabricating the electromagnetic radiation shutter of the present invention. The method comprises providing for a substrate, disposing a first release layer on the substrate and then forming a first flexible membrane on the first release layer. A second release layer is then disposed on the first flexible membrane followed by the formation of a stationary membrane on the second release layer, the first flexible membrane and a frame structure. After formation of the stationary membrane, a third release layer is disposed on the stationary membrane followed by the formation of a second flexible membrane on the third release layer and the stationary membrane. The process is completed by removing the first, second and third release layers to allow for a distal portion of the flexible membranes to be released from the stationary membrane.

As such the electromagnetic radiation shutter device driven by electrostatic force is capable deflecting electromagnetic radiation, specifically RF radiation, with minimal power required to activate the shutter. The electrodes in the flexible membranes are separated by a small gap that makes it possible to apply minimal electrostatic voltage across the electrodes to cause the membranes to uncurl into a closed shutter state. Additionally, the simplistic design of the shutter makes for a device that can be manufactured efficiently and at a minimal cost.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
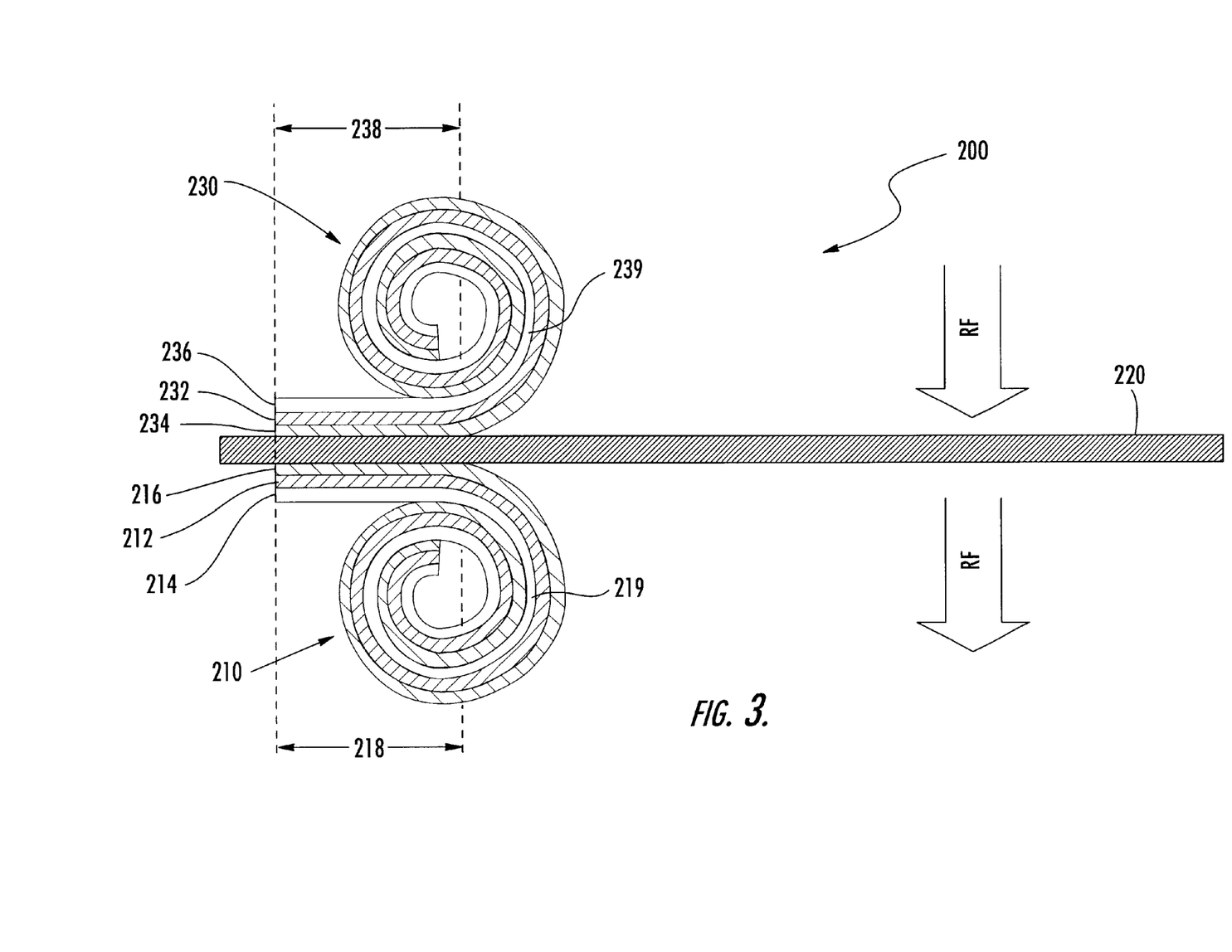
FIG. 3 is a cross-sectional view of an electromagnetic radiation shutter in an open state, in accordance with an embodiment of the present invention.
Figure 4:
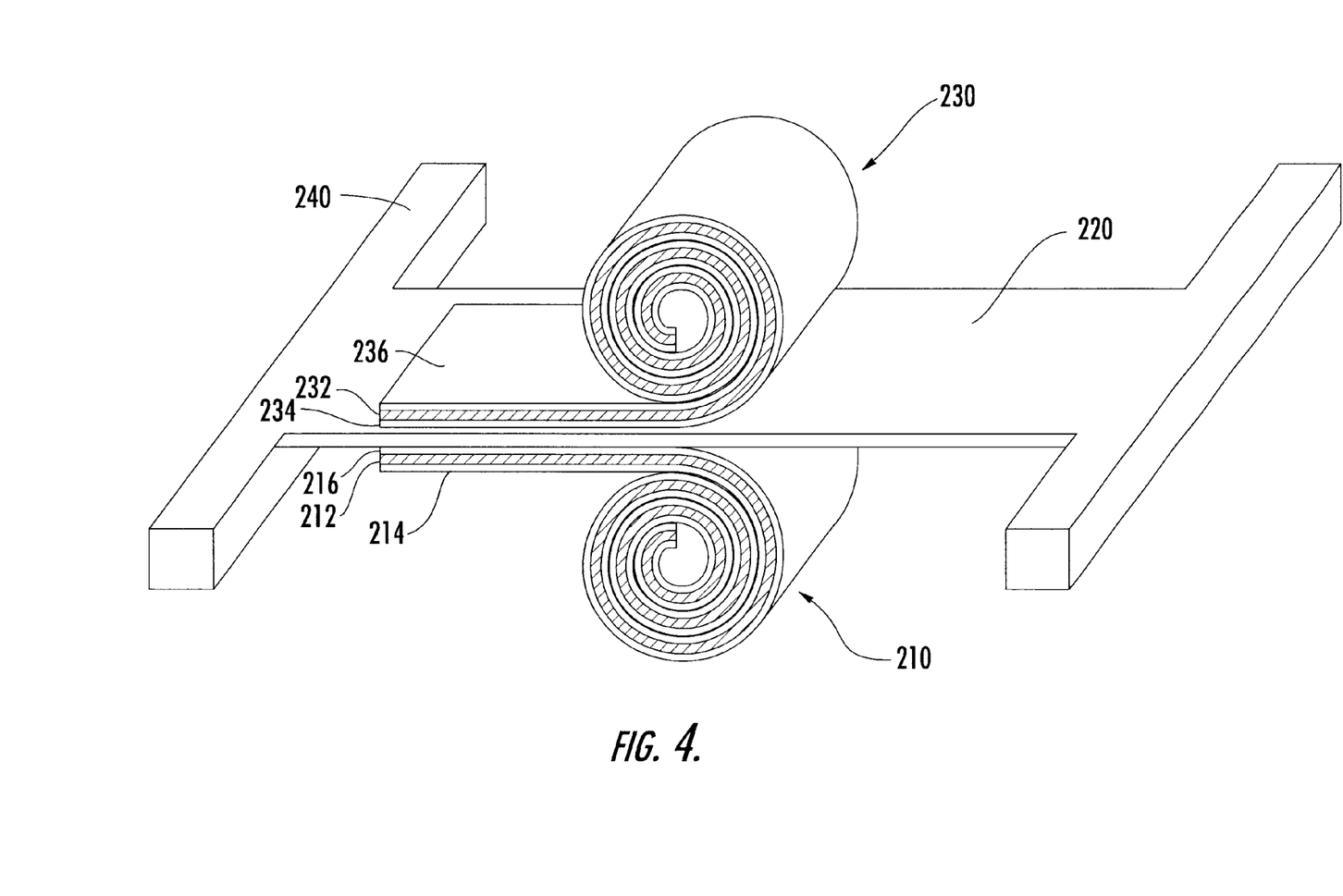
FIG. 4 is a perspective view of an electromagnetic radiation shutter in an open state, in accordance with an embodiment of the present invention.

Referring to FIGS. 3 and 4, a cross-sectional view and a perspective view of an electromagnetic radiation shutter is shown, in accordance with an embodiment of the present invention. As shown in FIG. 3, the layers of the device construct are arranged and shown vertically. In a first embodiment, an electrostatically actuated electromagnetic radiation shutter device 200 comprises a first flexible membrane 210 attached to the underside of a stationary membrane 220 and a second flexible membrane 230 attached to the topside of die stationary membrane. The electromagnetic radiation shutter device will, typically, be connected through the stationary membrane to a frame structure 240 that supports the stationary membrane and allows for the degree of motion necessary for the first and second flexible membranes to properly operate. Other support means may also be provided for that allow for the flexible membranes to properly curl and uncurl without impedance during shutter operation. In order to allow for the passage of electromagnetic radiation when the shutter is in an open position, the stationary membrane will be a fabricated from a non-conductive dielectric material(s) that is transparent to electromagnetic radiation.

The first and second flexible membranes 210 and 230 will comprise an electrode element 212 and 232 and one or more biasing/insulating elements 214, 216 and 234, 236. The electrode elements and insulating elements will typically form layers in the construct of the first and second flexible membranes 210 and 230. In the depicted embodiment, the electrode elements 212 and 232 are disposed between biasing/insulating elements 214, 216 and 234, 236.

The first and second flexible membranes 210 and 230 will also define a fixed portion 218 and 238 that is attached to the corresponding underside and topside of the stationary membrane and a distal portion 219 and 239 adjacent to the fixed portion and released from the corresponding underside and topside of the stationary membrane. The distal portions are released during fabrication by employing a sacrificial release layer between the flexible membranes and die stationary membrane. Further detailed discussion of the release layer is forthcoming in the sections pertaining to methods of fabricating the electromagnetic radiation shutter. The distal portion of the flexible membranes will typically be fully curled (i.e. rolled up) in an open shutter state (i.e. no voltage applied) and fully uncurled (i.e. parallel to the stationary membrane) in a closed shutter state (i.e. voltage applied). The curled state of the distal portion of the flexible membranes occurs upon release of the membranes from the stationary membrane and is caused by the bias in the flexible membrane induced during fabrication processing and/or biasing/insulation elements.

It is also possible and within the inventive concepts herein disclosed to form the flexible membranes 210 and 230 with a single biasing/insulating element disposed on either side of the electrode element or to form the flexible membrane with more than one biasing/insulating element disposed on any one side of the electrode element. The quantity and configuration of biasing/insulating elements will be dictated by many factors, including the degree of electrical insulation required and amount of positional bias provided by the biasing/insulating layers. Typically, a biasing/insulating layer will be positioned between the electrode element and the stationary membrane 220 to allow for proper electrostatic insulation between the electrode element of the first flexible membrane and the electrode element of the second membrane. It is also possible to provide for insulation layers in the construct of the stationary membrane.

In most embodiments, the biasing/insulating elements will be instrumental in providing positional bias to the flexible membrane (i.e. the flexible membranes should remain in a tightly rolled up position when no electrostatic force is applied to the electrode elements). Biasing in the flexible membrane may be accomplished by providing for biasing/insulating element and electrode element materials that differ in thickness, thermal coefficient of expansion or any other known biasing characteristic. Alternately, biasing may be induced during fabrication by employing process steps that create intrinsic stresses so as to curl the moveable membrane. For example, a polymeric biasing/insulating element can be deposited as a liquid and then cured by elevated temperatures so that it forms a solid biasing/insulating element. Preferably, the biasing/insulating element may comprise a polymer material having a higher thermal coefficient of expansion than the electrode element. Next, the biasing/insulating element and the electrode element are cooled, inducing stresses in the membrane due to differences in the thermal coefficients of expansion. The flexible membrane curls because the polymeric biasing/insulating element shrinks faster or to a greater degree than the electrode element.

Additionally, providing differential thermal coefficients of expansion between the biasing/insulating element layers and the electrode element layer can create bias in the membrane. Assuming an increase in temperature, the flexible membrane will curl toward the element having the lower thermal coefficient of expansion because the elements accordingly expand at different rates. As such, the flexible membrane having two elements with different thermal coefficients of expansion will curl toward the element having a lower thermal coefficient of expansion as the temperature rises.

Figure 5:
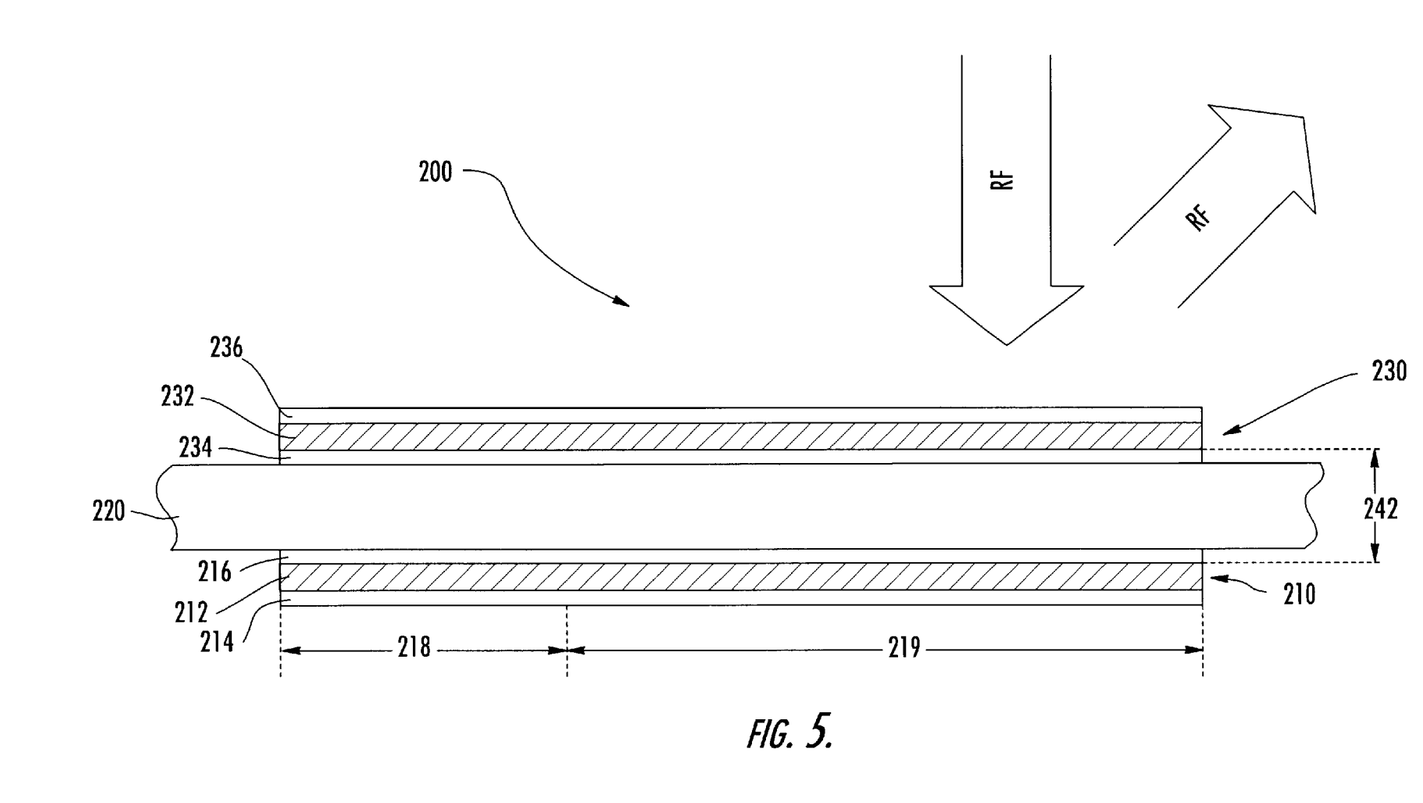
FIG. 5 is a cross-sectional view of an electromagnetic radiation shutter in a closed state, in accordance with an embodiment of the present invention.

In the FIG. 3 embodiment the electromagnetic radiation shutter is depicted in an open position, the first and second flexible membranes 210 and 230 are in a fully curled state that allows for RF radiation to pass through the unobstructed stationary membrane 220. When an electrostatic voltage is applied between the electrode elements 212 and 232 of the first and second flexible membranes, an electrostatic force is generated which pulls die first and second flexible membranes down to the stationary membrane, thereby uncurling the flexible films. As shown in FIG. 5, the electromagnetic radiation shutter 200 is depicted in a closed state (i.e. radiation will not be allowed to pass) indicated by the first and second membranes 210 and 230 being fully uncurled when electrostatic voltage is applied. When the voltage is released the intrinsic stress of the films cause them to once again curl away from the stationary substrate into the open position shown in FIG. 3.

The gap 242 between the electrode elements of the flexible membranes is relatively small in the instance where the flexible membranes are generally tangential to the stationary substrate. By allowing for a small gap, relatively small voltages, in the range of about 50 volts, are required to fully attract the flexible membranes to the stationary membrane. The thickness of the flexible membrane is an important factor in determining the operating voltage of the electromagnetic radiation shutter. Lower operating voltages can be achieved by implementing thin flexible membranes. A typical flexible membrane will have a thickness in the range of about 1 micrometer to about 7 micrometers. Additionally, the thickness of the stationary membrane also defines the thickness of gap 242 and, thus, is an important factor in determining the necessary operating voltage. A typical stationary membrane will have a thickness in the range of about 0.5 micrometers to about 2 micrometers.

To ensure the transmission of the radiation through the shutter, the surface area covered by the uncurled flexible membrane on the stationary membrane will typically be larger than the wavelength of the radiation. In addition, to ensure that the radiation is reflected when the shutter is in a closed position, the composite thickness of the electrode elements in the first and second flexible membranes will typically be greater than about 5 times the skin depth of the RF radiation. Skin depth is defined as $\delta=\mathrm{sqrt}(2/(\omega\mu\sigma))$ and is function of the conductive material used to form the electrode elements and the frequency of the electromagnetic radiation. Since die skin depth is dependent on the frequency of the radiation, lower frequencies will require a greater degree of thickness in the electrode elements and higher operating voltages.

In one embodiment of the invention the flexible membranes comprise biasing/insulating elements that are formed of a non-oxidation based insulator material, typically a polymer, such as polyimide or nitride. In many embodiments oxide based insulators are avoided if certain acids (such as hydrofluoric acid) are used in processing to remove release layers. The use of release layers are instrumental in the fabrication of the electromagnetic radiation shutter and will be discussed in more detail in the following description pertaining to methods of fabrication. Additionally, the flexible membranes comprise electrode elements that are formed of a suitable conductive material, such as gold. If the electrode elements are formed of gold, optionally a thin layer of adhesion promoting material may be used to promote adhesion between the gold interface and the adjoining elements. Typically, a thin layer of chromium is used as the adhesion promoting material and is deposited either prior to depositing the electrode element or after the electrode element has been deposited to promote adhesion.

The overall uncurled plan view shape of the flexible membranes will be dictated by the necessary area to be shuttered and will typically be defined by the plan view shape of the biasing/insulating elements. In most embodiments the plan view shape of the shutter will generally be square or rectangular. The electrode elements of the first and second flexible membranes will typically be shaped so as provide for efficient and reliable uncurling and curling of the flexible membranes. The electrode elements may be generally rectangular in plan view shape or the electrode elements may define any other shape suitable for the application. In embodiments having rectangular shaped electrode elements the flexible membranes will typically fully uncurl once sufficient voltage is applied. In other embodiments the shape of the electrode element will provide for analog control of the degree of uncurling that the flexible membrane will undergo when subjected to different applied voltages. For instance, a plan view shaped tapered electrode element (i.e. the electrode narrows in width as the flexible membrane is uncurled) may be provided to allow for the analog control of the uncurling of the flexible membrane. In this instance, applying different voltages to the tapered electrode elements corresponds to variances in the degree of uncurling of the membrane.

The stationary membrane will typically comprise a thin layer of a non-conductive, organic insulator, such as polyimide. The stationary membrane will characteristically be transparent to electromagnetic radiation, such that electromagnetic radiation transmissions are capable of passing through the stationary membrane when the shutter is positioned in an open state. The stationary membrane should be constructed as thin as possible (typically in the range of about 0.5 micrometers to about 2 micrometers) while remaining structurally sound. In alternate embodiments it may be desired to form the stationary membrane from more that one material/layer for the purpose of increasing strength for a given thickness.

In another embodiment of the present invention, a series of RF shutter devices are employed in an array to provide for large coverage area and high-speed actuation. In contrast, the construction of a singular RF shutter that would provide the same degree of area coverage would characteristically require higher operating voltages and/or result in slower speed uncurling of the flexible membranes. By implementing smaller RF shutters that are grouped together so as to replicate the coverage area of a larger RF shutter it is possible to create a high speed shutter that will uncurl at faster rates than a large single RF shutter.

Figure 6A:
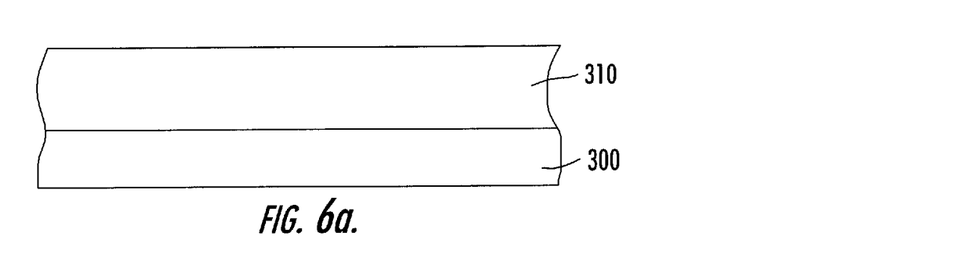
FIGS. 6a–6e are cross-sectional views of an electromagnetic radiation shutter construct during various stages of fabrication in accordance with a method for making embodiment of the present invention.

FIGS. 6*a*–6*e* are cross-sectional views of various stages of fabrication of the to electromagnetic radiation shutter, in accordance with a method of making embodiment of the present invention. The following illustrations and discussions are shown by way of example of one method for fabricating the electromagnetic radiation shutter device of the present invention. Other applicable fabrication methods may also be used without departing from the inventive concepts herein disclosed. Additionally, the present invention provides for a method of making an electrostatic radiation shutter device driven by electrostatic forces. This method has the advantage of forming both first and second flexible membranes in one continuous operation that provides for an adequate framing structure to house the electromagnetic radiation shutter of the present invention FIG. 6*a* is an illustration of a cross-sectional view of a substrate 300 that has a first release layer 310 disposed thereon. The substrate will typically comprise silicon, although any other suitable material may also be used to form the substrate of the present invention. Examples of alternative substrate materials include, glass, polymeric and the like. The first release layer will typically comprise a oxide based material, such as a thermal oxide material. Characteristically the first release layer must be susceptible to being removed during a subsequent release process. Typically, the removal of the first release layer will allow the subsequently built RF shutter device to be removed or separated from the underlying substrate. In the instance where a thermal oxide is used as the first release layer, the release operation will typically employ an acid etch, such as hydrofluoric acid, to remove the first release layer. The thickness of the first release layer will typically be in the range of about 0.1 micrometers to about 0.3 micrometers. The first release layer is typically formed on the substrate by an oxide growth process or a conventional deposition technique, such as PVD or CVD.

Figure 6B:
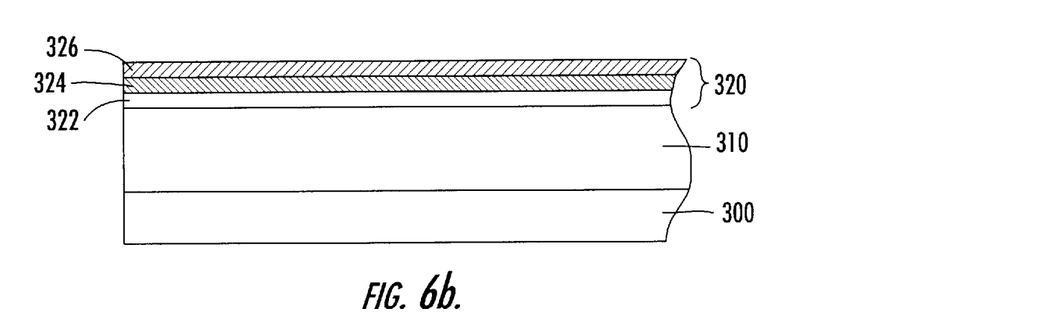

FIG. 6b depicts a cross-sectional view of the electromagnetic radiation shutter construct after the first flexible membrane 320 has been formed on the substrate. Typically, the first flexible membrane is formed by depositing layers on the first release layer 310. In the embodiment shown, the first flexible membrane comprises a first biasing/insulating element layer 322 disposed on the first release layer, a first electrode element layer 324 disposed on the first biasing/insulating element layer and a second biasing/insulating element layer 326 disposed on the first electrode element layer. The layering of the first flexible membrane is shown by way of example. It is also possible to construct the first flexible membrane with different combinations of biasing/insulating element layers and electrode element layers without departing from the inventive concepts herein disclosed. The first and second biasing/insulating element layers will typically be disposed using a standard deposition technique, such as low-pressure chemical vapor deposition (LPCVD) or a suitable spin-on process. The first and second biasing/insulating element layers will generally have a layer thickness in the range of about 0.2 micrometers to about 4.0 micrometers.

The first electrode element will typically be deposited and the shape of the electrode defined by using standard photolithography and etching or liftoff techniques. The first electrode element layer will generally have a layer thickness in the range of about 0.2 micrometers to about 2.0 micrometers. In the embodiments in which the first electrode layer is formed of gold it may be necessary to provide for thin intermediate adhesion promoting layers, typically chromium (not shown in FIG. 6) between the gold layer and the adjacent biasing/insulating layers.

Figure 6C:
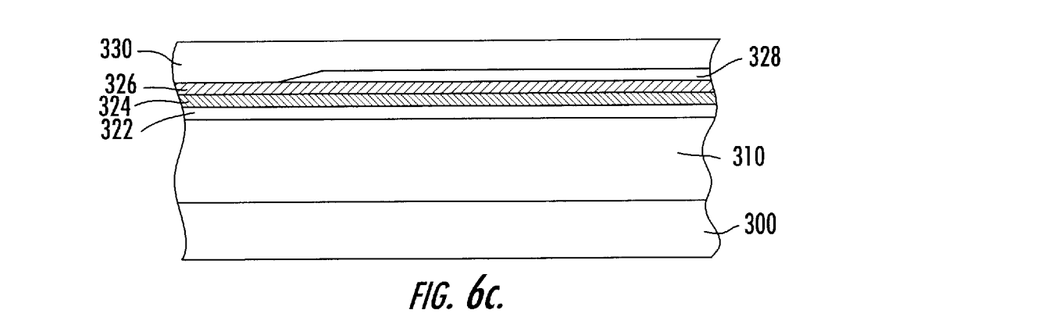

FIG. 6c depicts a cross-sectional view of the shutter construct after the stationary membrane 330 has been formed above the first flexible membrane. A second release layer 328 is disposed on the second biasing/insulating element layer. The second release layer serves to release the first flexible membrane from the underside of the stationary membrane. The second release layer will typically comprise a oxide based material, such as a thermal oxide material. The second release layer will generally have a thickness in the range of about 0.1 micrometers to about 0.3 micrometers. The second release layer is typically formed on the second biasing/insulating element layer by patterning a release layer region and using a conventional deposition technique, such as PVD or CVD. The patterning of the release layer region provides for a region devoid of release layer that serves as the attachment point between the first flexible membrane and the stationary membrane.

The stationary membrane layer 330 will typically comprise a non-organic insulating material, such as polyimide. The stationary membrane is typically disposed using conventional LPCVD or another suitable spin-on process. A thin stationary membrane, in the range of about 0.5 micrometers to about 2.0 micrometers is typically desired to insure low operating voltages for the electromagnetic radiation shutter device. While most embodiments of die invention will have a single layer stationary membrane it also possible to construct the stationary membrane from more than one layer. The stationary membrane layer will typically extend outward and be disposed upon a support structure (not shown in the FIG. 6 depictions). The support structure may comprise posts or a frame structure attached to the underlying substrate or the frame structure may comprise the underlying substrate having been properly etched to define the support structure and a cavity. In the instance in which posts or a frame structure are used, they may be attached to the underlying substrate by a conventional bonding process. The support structure is shown by way of example, other support means may also be possible to provide adequate suspension to the shutter device or the shutter device may be formed without a support means for subsequent attachment in other MEMS devices or systems. For instance, a support structure may be constructed above the stationary membrane, subsequent release processing would entirely release the shutter device from the substrate and the device would then be attached to some other structure.

Figure 6D:
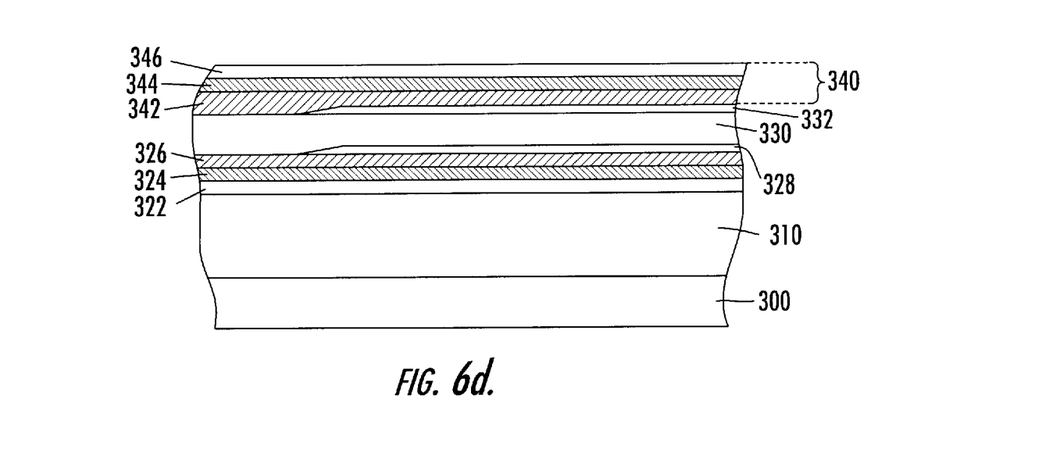

FIG. 6d illustrates a cross-sectional view of the electromagnetic radiation shutter construct after the second flexible membrane 340 has been formed above the stationary membrane 330. Prior to constructing the second flexible membrane, a third release layer 332 is patterned and deposited on the stationary membrane. The third release layer will be patterned so that it underlies the subsequently released portion of the second flexible membrane and defines a second flexible membrane to stationary membrane attachment point. The third release layer, typically an oxide, will subsequently be removed to facilitate the release of the second flexible membrane from the stationary membrane. A conventional deposition technique, such as PVD or CVD, is typically used to deposit the third release layer.

In the illustrated embodiment of FIG. 6d, the second flexible membrane comprises a third biasing/insulating element layer 342 disposed on the third release layer and stationary membrane, a second electrode element layer 344 disposed on the third biasing/insulating element layer and a fourth biasing/insulating element layer 346 disposed on the second electrode element layer. The layering of the second flexible membrane is shown by way of example. It is also possible to construct the second flexible membrane with different combinations of biasing/insulating element layers and electrode element layers without departing from the inventive concepts herein disclosed. While in most embodiments the second flexible membrane will generally mirror the first flexible membrane in terms of layering construct, it is not essential to the invention disclosed that the second flexible membrane comprise the same layering construct as the first flexible membrane. The third and fourth biasing/insulating element layers will typically be disposed using a standard deposition technique, such as low-pressure chemical vapor deposition (LPCVD) or a suitable spin-on process. The third and fourth biasing/insulating element layers will generally have a layer thickness in the range of about 0.2 micrometers to about 4.0 micrometers.

The second electrode element will typically be deposited and the shape of the electrode defined by using standard photolithography and etching or liftoff techniques. While in most embodiments the shape of the second electrode element will generally mirror the shape of the first electrode element, it is not essential to the invention disclosed that the shape of the second electrode element be equivalent to the shape of the first electrode element. The second electrode element layer will generally have a layer thickness in the range of about 0.2 micrometers to about 2.0 micrometers. In the embodiments in which the second electrode layer is formed of gold it may be necessary to provide for thin intermediate adhesion promoting layers, typically chromium (not shown in FIG. 6) between the gold layer and the adjacent biasing/insulating layers.

Figure 6E:
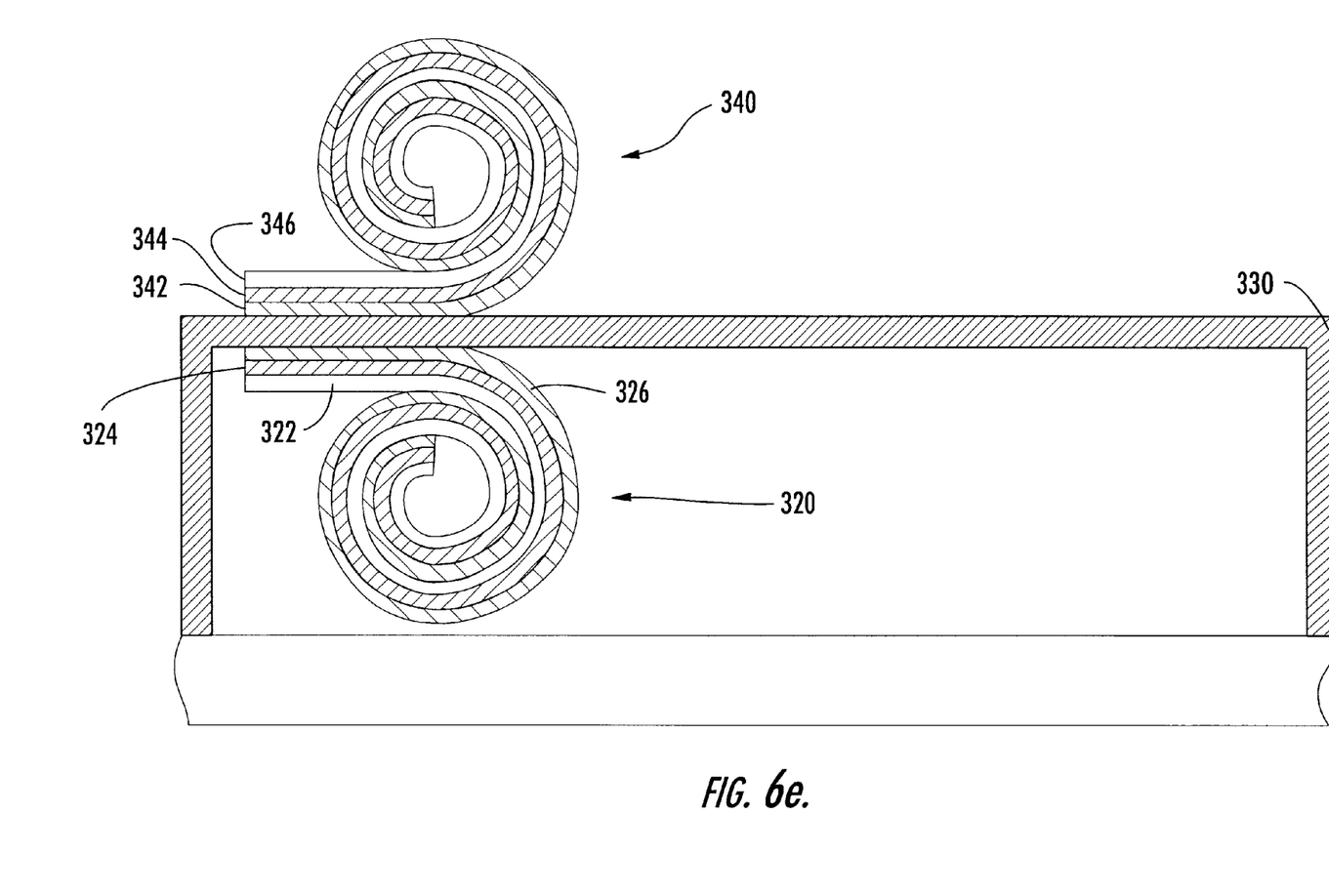

FIG. 6e depicts a cross-sectional view of the electromagnetic radiation shutter as a completed structure having undergone release layer removal. The first, second and third release layers are removed by exposing the device to a suitable etchant, typically an acid bath. The chosen etchant should be suitable to remove die chosen release layer materials while not adversely effecting the surrounding flexible membrane and stationary membrane materials. Upon removal of the release layers the flexible membranes will separate from the stationary membrane and underlying substrate. The intrinsic stress that is built-up in the flexible membranes will cause the flexible membranes to curl, as shown, upon release.

As such the electromagnetic radiation shutter device driven by electrostatic force is capable deflecting electromagnetic radiation with minimal power required to activate the shutter. The electrodes in the flexible membranes are separated by a small gap, which makes it possible to apply minimal electrostatic voltage across the electrodes to cause the membranes to uncurl into a closed shutter state. Additionally, the simplistic design of the shutter makes for a highly reliable device that can be manufactured efficiently and at a minimal cost.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electromagnetic radiation shutter driven by electrostatic forces, comprising:
   a stationary membrane capable of allowing electromagnetic radiation transmission therethrough;
   a first flexible membrane comprising an electrode element and at least one biasing element, wherein the first flexible membrane includes a fixed portion attached to the underside of the stationary membrane and a distal portion adjacent to the fixed portion and released from the underside of the stationary membrane; and
   a second flexible membrane comprising an electrode element and at least one biasing element, wherein the second flexible membrane includes a fixed portion attached to the topside of the stationary membrane and a distal portion adjacent to the fixed portion and released from the topside of the stationary membrane,
   whereby a voltage differential established between the electrode element of the first flexible membrane and the electrode element of the second flexible membrane moves said first and second flexible membranes relative to said stationary membrane to thereby deflect electromagnetic radiation.

2. The electromagnetic radiation shutter of claim 1, further comprising a frame structure that serves to support the stationary membrane and allow for unobstructed movement of the flexible membranes.

3. The electromagnetic radiation shutter of claim 2, wherein the frame structure comprises a substrate.

4. The electromagnetic radiation shutter of claim 1, wherein the first flexible and second flexible membranes each comprise two biasing elements.

5. The electromagnetic radiation shutter of claim 4, wherein the first and second flexible membranes comprise an electrode element intermediate a first and second biasing element.

6. The electromagnetic radiation shutter of claim 1, wherein the biasing element provides for electrical insulation between the electrode element of the first flexible membrane and the electrode element of the second flexible membrane.

7. The electromagnetic radiation shutter of claim 1, wherein the stationary membrane comprises a non-conductive dielectric material.

8. The electromagnetic radiation shutter of claim 1, wherein the at least one biasing element comprises a polymeric material.

9. The electromagnetic radiation shutter of claim 1, wherein the at least one biasing element has a higher coefficient of expansion than the electrode element.

10. The electromagnetic radiation shutter of claim 1, wherein the first and second flexible membranes are positionally biased so as to remain in a generally fully curled position absent electrostatic force.

11. The electromagnetic radiation shutter of claim 1 wherein the electrode elements of the first and second flexible membranes comprise gold.

12. The electromagnetic radiation shutter of claim 11, further comprising at least one adhesion-promoting element disposed adjacent to the electrode element to promote adhesion between the electrode element and subsequent elements of the flexible membrane.

13. The electromagnetic radiation shutter of claim 12, wherein the at least one adhesion promoting element comprises chromium.

14. The electromagnetic radiation shutter of claim 1, wherein the electrode elements of the first and second flexible membranes have a predetermined plan view shape that minimizes the voltage required to activate the shutter.

15. The electromagnetic radiation shutter of claim 1, wherein the electrode elements of the first and second flexible membranes have a generally rectangular plan view shape.

16. The electromagnetic radiation shutter of claim 1, wherein the electrode elements of the first and second flexible membranes are tapered in plan view shape such that the width of the electrode elements decreases as the distance from the fixed portion of the flexible membranes increases.

17. The electromagnetic radiation shutter of claim 1, wherein the composite thickness of the electrode elements of the first and second flexible membranes is greater than about 5 times the skin depth of the RF radiation being shuttered.

18. The electromagnetic radiation shutter of claim 1, wherein the biasing element comprises a non-oxidation based insulator material.

19. The electromagnetic radiation shutter of claim 1, wherein the shutter deflects radio frequency (RF) electromagnetic radiation.

20. The electromagnetic radiation shutter of claim 1, wherein the electromagnetic radiation shutter is a microelectromechanical system (MEMS) device.

21. An electromagnetic radiation shutter array comprising more than one electromagnetic radiation shutter driven by electrostatic forces, the shutters including:
  a stationary membrane capable of allowing electromagnetic radiation transmission therethrough;
  a first flexible membrane comprising an electrode element and at least one biasing element, wherein the first flexible membrane includes a fixed portion attached to the underside of the stationary membrane and a distal portion adjacent to the fixed portion and released from the underside of the stationary membrane; and
  a second flexible membrane comprising an electrode element and at least one biasing element, wherein the second flexible membrane includes a fixed portion attached to the topside of die stationary membrane and a distal portion adjacent to the fixed portion and released from the topside of the stationary membrane,
  whereby a voltage differential established between the electrode element of the first flexible membrane and the electrode element of the second flexible membrane moves said first and second flexible membranes relative to said stationary membrane to thereby deflect electromagnetic radiation.

22. The array of claim 21, wherein the first and second flexible membranes of the shutters comprise an electrode element intermediate a first and second biasing element.

23. The array of claim 21, wherein the first and second flexible membranes of the shutters are positionally biased so as to remain in a generally fully curled position absent electrostatic force.

24. The array of claim 21, wherein the electrode elements of the first and second flexible membranes have a predetermined plan view shape that minimizes the voltage required to activate the shutter.

25. The array of claim 21, wherein the shutters deflect radio frequency (RF) electromagnetic radiation.

26. The array of claim 21, wherein the electromagnetic radiation shutters arc microelectromechanical system (MEMS) devices.

27. A method for shuttering electromagnetic radiation in a device driven by electrostatic forces, the method comprising:
  providing for a electromagnetic radiation shutter having a stationary membrane capable of allowing electromagnetic radiation transmission therethrough, a first flexible membrane attached to the underside of the stationary membrane and comprising an electrode element and at least one biasing element, and a second flexible membrane attached to the topside of the flexible membrane and comprising an electrode element and at least one biasing element;
  transmitting electromagnetic radiation through the stationary membrane;
  applying electrostatic voltage across the electrode element of the first flexible membrane and the electrode element of the second flexible membrane;
  moving the first and second flexible membranes, in response to the application of voltage, from an open state in which the membranes are generally curled to a closed state in which the membranes are generally parallel with the stationary membrane; and
  deflecting the electromagnetic radiation at the flexible membranes positioned in the closed state.

28. The method of claim 27, further comprising:
  removing the electrostatic voltage applied across the electrode elements of the first and second flexible membranes;
  moving the first and second flexible membranes, in response to the removal of voltage, from a closed state in which the membranes are generally parallel with the stationary membrane to an open state in which the membranes are generally curled; and
  transmitting electromagnetic radiation through the stationary membrane.

29. The method of claim 27, wherein transmitting electromagnetic radiation further comprises transmitting RF electromagnetic radiation and deflecting electromagnetic radiation further comprises deflecting RF electromagnetic radiation.

30. A method for fabricating an electromagnetic radiation shutter driven by electrostatic forces, the method comprising the steps of
  providing for a substrate;
  disposing a first release layer on the substrate;
  forming a first flexible membrane on the first release layer;
  disposing a second release layer on the first flexible membrane;
  forming a stationary membrane on the second release layer, the first flexible membrane and a frame structure;
  disposing a third release layer on the stationary membrane;
  forming a second flexible membrane on the third release layer and the stationary membrane; and
  removing the first, second and third release layers to allow for a distal portion of the flexible membranes to be released from the stationary membrane.

31. The method of claim 30, wherein forming a first flexible membrane on the first release layer further comprises disposing a first biasing layer on the first release layer, disposing a first electrode layer on the first biasing layer and disposing a second biasing layer on the electrode layer.

32. The method of claim 30, wherein disposing a second release layer further comprises patterning a second release layer region on the first flexible membrane to allow for the first flexible membrane to form a fixed portion with the stationary membrane.

33. The method of claim 30, wherein disposing a third release layer further comprises patterning a third release layer region on the stationary membrane to allow for the second flexible membrane to form a fixed portion with the stationary membrane.

34. The method of claim 30, wherein forming a second flexible membrane further comprises disposing a third biasing layer on the third release layer and stationary membrane, disposing a second electrode layer on the third biasing layer and disposing a fourth biasing layer on the second electrode layer.

* * * * *